United States Patent
Bae

(10) Patent No.: US 11,163,328 B1
(45) Date of Patent: Nov. 2, 2021

(54) CLOCK MONITORING CIRCUIT

(71) Applicant: SK hynix Inc., Icheon (KR)

(72) Inventor: Sang Min Bae, Icheon (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 17/151,548

(22) Filed: Jan. 18, 2021

(30) Foreign Application Priority Data

Aug. 19, 2020 (KR) .................. 10-2020-0103792

(51) Int. Cl.
 *G06F 1/06* (2006.01)
 *H03K 5/133* (2014.01)
 *H03L 7/00* (2006.01)
 *H03K 5/00* (2006.01)

(52) U.S. Cl.
 CPC .............. *G06F 1/06* (2013.01); *H03K 5/133* (2013.01); *H03L 7/00* (2013.01); *H03K 2005/0015* (2013.01)

(58) Field of Classification Search
 None
 See application file for complete search history.

(56) References Cited

U.S. PATENT DOCUMENTS

| | | | |
|---|---|---|---|
| 5,557,280 A | * | 9/1996 | Marsh .................. G06K 7/0008 342/44 |
| 7,082,453 B1 | | 7/2006 | Shackleford et al. |
| 7,483,327 B2 | | 1/2009 | Qureshi et al. |

* cited by examiner

*Primary Examiner* — Cassandra F Cox

(57) ABSTRACT

A monitoring circuit comprises a clock generator generating a first clock, a code generator generating an output code by varying a value of an input code in response to an input clock, receiving a feedback signal, and varying the value of the input code by performing set operations in a first mode and performing inverse set operations in a second mode, and an operation controller transmitting the first clock and a start code when the code generator enters the first mode, setting the output code as a counting code when the code generator exits from the first mode, transmitting a second clock and the counting code when the code generator enters the second mode, and counting a toggling number of the second clock in the second mode until the output code has a value identical with that of the start code.

18 Claims, 7 Drawing Sheets

CLOCK MONITORING CIRCUIT

CROSS-REFERENCE TO RELATED APPLICATION

This application claims priority under 35 U.S.C. § 119 to Korean Patent Application No. 10-2020-0103792 filed on Aug. 19, 2020, which is incorporated herein by reference in its entirety.

BACKGROUND

1. Field

Embodiments relate to a semiconductor design technology, and particularly, to a circuit for monitoring a clock, which is used in a semiconductor device.

2. Discussion of the Related Art

As the VLSI process technology is improved, a semiconductor circuit is more influenced by a process, voltage, and temperature (PVT) variation.

In particular, a clock generation circuit used to generate a clock within a semiconductor device, for example, a ring oscillator may be significantly influenced by such a PVT variation. That is, the ring oscillator included in the semiconductor device in order to generate a clock set as a specific target frequency may generate a clock having a significant frequency difference from the specific target frequency depending on a PVT variation.

Accordingly, conventionally, a method of directly counting a toggling count of the clock generated by the ring oscillator and checking whether a difference is present between a generation frequency of a clock and a specific target frequency and how much difference is present exists.

As the size of a semiconductor device is reduced and the operating speed of the semiconductor device is increased, if the frequency of a clock used within the semiconductor device is increased, for example, if the frequency of the clock becomes gigahertz (GHz) or more, it may be difficult to use the existing method. That is, it may be difficult to use a method of directly counting a toggling count of a clock generated by the ring oscillator.

Accordingly, conventionally, a method of dividing the frequency of a clock generated by the ring oscillator at a predetermined ratio using a clock division circuit and counting the divided clock is used.

However, the method of counting the divided clock may have many errors in measurement compared to the method of directly counting a clock generated by the ring oscillator.

SUMMARY

Various embodiments are directed to a monitoring circuit capable of accurately counting a toggling count of a clock generated with a high frequency by a ring oscillator.

In an embodiment, a monitoring circuit, may include: a clock generator suitable for generating a first clock having a first frequency, the first frequency being different from a target frequency depending on a process, voltage, and temperature (PVT) variation; a code generator suitable for generating an output code by varying a value of an input code in response to an input clock, receiving a feedback signal associated with the output code, and varying the value of the input code by performing one or more set operations in a first mode and performing one or more inverse set operations in a second mode; and an operation controller suitable for controlling the code generator to enter the first mode in a test section, transmitting the first clock and a start code as the input clock and the input code, respectively, to the code generator at a first time when the code generator enters the first mode, setting the output code as a counting code at a second time when the code generator exits from the first mode, controlling the code generator to enter the second mode in a check section, transmitting a second clock and the counting code as the input clock and the input code, respectively, to the code generator at a third time when the code generator enters the second mode, and counting a toggling number of the second clock in the second mode until the output code has a value identical with a value of the start code to generate monitoring information. The operation controller may receive, from an outside of the monitoring circuit, the second clock having a second target frequency lower than the first target frequency.

The operation controller: may control the code generator to enter the first mode at the first time in the test section; and may control the code generator to exit from the first mode at the second time, a first time interval between the first time and the second time being predetermined.

The operation controller: may control the code generator to enter the second mode at the third time in the check section; and may control the code generator to exit from the second mode at a fourth time in response to the generated monitoring information.

The operation controller may start or may terminate the test section, or the check section, or both in response to an externally input control signal.

The toggling number of the second clock in the second mode may be a first toggling number. The operation controller: may control the code generator to enter the first mode at the first time when edges of the first clock and the second clock are synchronized after the test section has started; and may control the code generator to exit from the first mode at the second time when a second toggling number of the second clock reaches a given number from the first time.

The operation controller: may control the code generator to enter the second mode at the third time when an edge of the second clock is synchronized after the operation of the check section has started; and may control the code generator to exit from the second mode at the fourth time when the edge of the second clock is synchronized after the monitoring information has been generated.

The clock generator may generate the first clock in response to an enable signal received from the operation controller.

The operation controller: may control the clock generator to generate the first clock by activating the enable signal in response to the control signal; and may control the clock generator to stop generating the first clock by deactivating the enable signal when the code generator exits from the first mode.

The operation controller may include: a signal generator suitable for generating the enable signal and a mode selection signal in response to the control signal and the first and second clocks; a clock selector suitable for selecting the first clock during the first time interval of the first mode in response to the mode selection signal, transmitting the selected first clock to the code generator during the first time interval, selecting the second clock during a second time interval of the second mode, the second time interval being between the third time and the fourth time, and transmitting the selected second clock to the code generator during the second time interval; a code comparator suitable for comparing a value of the output code and a value of the start code when the second clock toggles during the second time interval in response to the mode selection signal; a code storage suitable for storing the output code as the counting code at the second time when the code generator exits from the first mode, and transmitting the stored counting code to the code generator at the third time when the code generator enters the second mode; and a counter suitable for counting the first toggling number of the second clock during the second time interval of the second mode in response to the mode selection signal and generating the monitoring information in response to an output signal of the code comparator.

The code comparator: may store the start code; may transmit the stored start code to the code generator at the first time when the code generator enters the first mode, the first time being determined in response to the mode selection signal; and may compare a value of the output code and a value of the stored start code when the second clock toggles during the second time interval of the second mode.

The code storage: may store the start code; may transmit the stored start code to the code generator at the first time when the code generator enters the first mode, the first time being determined in response to the mode selection signal; and may transmit the stored start code to the code comparator during the second time interval of the second mode.

The signal generator may include: an internal signal generator suitable for generating an internal enable signal and the mode selection signal in response to the control signal; a first synchronizer suitable for synchronizing the internal enable signal with an edge of the second clock and transmitting the synchronized internal enable signal as the enable signal to the clock generator; and a second synchronizer suitable for detecting a time at which edges of the first clock received from the clock generator and the second clock are synchronized.

The clock selector may include: a multiplexer suitable for selecting one of the first clock and the second clock in response to the mode selection signal; and a clock transmitter suitable for transmitting the selected clock to the code generator in response to an output signal of the second synchronizer.

In an embodiment, a method for controlling a monitoring circuit, the method may include: providing a first clock as an input clock and a start code as an input code to a code generator at a first time when the code generator enters a first mode; varying a value of the input code to generate an output code by performing one or more set operations in the first mode; setting the output code as a counting code at a second time when the code generator exits the first mode; providing a second clock as the input clock and the counting code as the input code at a third time when the code generator enters a second mode, the second clock having a frequency lower than that of the first clock; varying the value of the input code to generate the output code by performing one or more inverse set operations in the second mode; and counting a toggling number of the second clock in the second mode until a value of the output code becomes equal to that of the start code to generate monitoring information.

The method may further include: controlling the code generator to enter the first mode at the first time; and controlling the code generator to exit from the first mode at the second time, a first time interval between the first time and the second time being predetermined.

The method may further include: controlling the code generator to enter the second mode at the third time; and controlling the code generator to exit from the second mode at a fourth time in response to the generated monitoring information.

The code generator may perform the set operations when the first clock toggles in the first mode, and the code generator may perform the inverse set operations when the second clock toggles in the second mode.

The code generator may include: a plurality of registers generating the output code; and a logic gate receiving a plurality of bits of the output code and performing a logical operation on the received bits of the output code to provide a signal indicative of a logical operation result to one of the plurality of registers.

In accordance with the present embodiments, a ring oscillator included in a semiconductor device inputs, to linear feedback shift registers (LFSRs), a clock generated to have a relatively high frequency along with a start code. The LFSRs may perform a set operation corresponding to a high-speed toggling operation, and generate a counting code as the results of the set operation. Thereafter, the LFSRs receive an external input clock having a relatively low frequency along the counting code, and perform an inverse operation of the set operation corresponding to a low-speed toggling operation.

Accordingly, a toggling count of a clock necessary between the start code and the counting code can be counted at a low speed.

Accordingly, there is an effect in that a toggling count of a clock generated to have a high frequency by the ring oscillator can be accurately counted.

DETAILED DESCRIPTION

Figure 1:
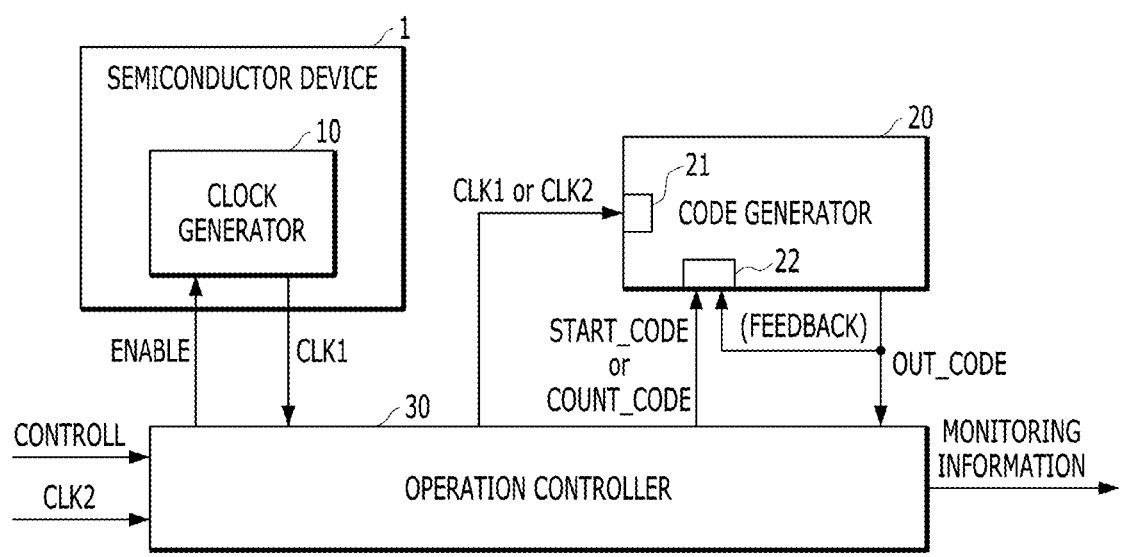
FIG. 1 illustrates an operation of a monitoring circuit according to an embodiment.

Various examples of the disclosure are described below in more detail with reference to the accompanying drawings. Aspects and features of the present technology, however, may be embodied in different ways to form other embodiments, including variations of any of the disclosed embodiments. Thus, the disclosed technology is not to be construed as being limited to the embodiments set forth herein. Rather, the described embodiments are provided so that this disclosure is thorough and complete, and fully conveys the disclosure to those skilled in the art to which the technology pertains. Throughout the disclosure, like reference numerals refer to like parts throughout the various figures and examples of the disclosure. It is noted that reference to "an embodiment," "another embodiment," or the like does not necessarily mean a single embodiment, and different references to any such phrase are not necessarily to the same embodiment(s).

It will be understood that, although the terms "first," "second," "third," and so on may be used herein to identify various elements, these elements are not limited by these terms. These terms are used to distinguish one element from another element that otherwise have the same or similar names. Thus, a first element in one instance could be termed a second or third element in another instance without departing from the spirit and scope of the technology.

The drawings are not necessarily to scale and, in some instances, proportions may have been exaggerated in order to clearly illustrate features of the embodiments. When an element is referred to as being connected or coupled to another element, it should be understood that the former can be directly connected or coupled to the latter, or electrically connected or coupled to the latter via one or more intervening elements therebetween. In addition, it will also be understood that when an element is referred to as being "between" two elements, it may be a single element between the two elements, or one or more intervening elements may also be present.

The terminology used herein is for the purpose of describing particular embodiments only and is not intended to be limiting of the disclosed technology. As used herein, singular forms are intended to include the plural forms and vice versa, unless the context clearly indicates otherwise. Similarly, the indefinite articles "a" and "an" mean one or more, unless it is clear from the language or context that only one is intended.

It will be further understood that the terms "comprises," "comprising," "includes," and "including" when used in this specification, specify the presence of the stated elements and do not preclude the presence or addition of one or more other elements. As used herein, the term "and/or" includes any combinations of one or more of the associated listed items.

Unless otherwise defined, all terms including technical and scientific terms used herein have the same meaning as commonly understood by one of ordinary skill in the art to which the technology belongs in view of the disclosure. It will be further understood that terms, such as those defined in commonly used dictionaries, should be interpreted as having a meaning that is consistent with their meaning in the context of the disclosure and the relevant art, and not be interpreted in an idealized or overly formal sense unless expressly so defined herein.

In the following description, numerous specific details are set forth in order to provide a thorough understanding of the technology. The technology may be practiced without some or all of these specific details. In other instances, well-known process structures and/or processes have not been described in detail in order not to unnecessarily obscure the technology.

It is also noted, that in some instances, as would be apparent to those skilled in the relevant art, a feature or element described in connection with one embodiment may be used singly or in combination with other features or elements of another embodiment, unless otherwise specifically indicated.

Embodiments of the disclosure are described in detail below with reference to the accompanying drawings, wherein like numbers refer to like elements.

FIG. 1 is a diagram illustrating an operation of a monitoring circuit according to an embodiment.

Figure 5:
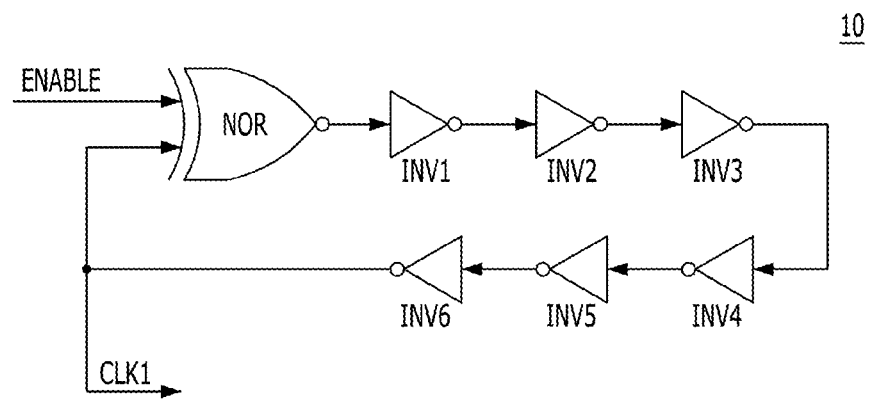
FIG. 5 is a diagram illustrating a clock generator suitable for use as a clock generator included in the monitoring circuit of FIG. 1 according to an embodiment.

FIG. 5 is a diagram illustrating a clock generator suitable for use as a clock generator 10 included in the monitoring circuit of FIG. 1 according to an embodiment.

First, referring to FIG. 1, the monitoring circuit according to an embodiment may include a semiconductor device 1 including the clock generator 10, a code generator 20, and an operation controller 30.

The clock generator 10 included in the semiconductor device 1 may be an element designed for generating a target clock having a first target frequency. In this case, the clock generator 10 may generate a first clock CLK1 having a frequency different from a first target frequency depending on a process, voltage, and temperature (PVT) variation. That is, the clock generator 10 has an object of generating the target clock having the first target frequency in response to an enable signal ENABLE, but may generate the first clock CLK1 having a frequency different from the first target frequency due to the PVT variation.

Specifically, referring to both FIGS. 1 and 5, the clock generator 10 may include a NOR gate to which the enable signal ENABLE and the first clock CLK1 are input and even-numbered inverters INV1 to INV6 for outputting the first clock CLK1 again by delaying the output of the NOR gate. In this case, the NOR gate and the even-numbered inverters INV1 to INV6 may be coupled in a feedback loop form. Accordingly, in the clock generator 10, in response to the enable signal ENABLE of "0," the first clock CLK1 is output as "1" and simultaneously "1" is fed back and input to the NOR gate through the NOR gate and the six inverters INV1 to INV6. Accordingly, in response to the signal "1" fed back and input to the NOR gate, the first clock CLK1 is output as "0" and simultaneously "0" is fed back and input to the NOR gate again through the NOR gate and the six inverters INV1 to INV6, so that the state of the clock generator 10 returns to its initial state. The first clock CLK1 may toggle as such a task is repeated while the enable signal ENABLE is "0" as described above.

In contrast, in response to the enable signal ENABLE of "1", the first clock CLK1 is output as "0" and simultaneously "0" is fed back and input to the NOR gate through the NOR gate and the six inverters INV1 to INV6. As described above, the signal "0" is fed back and input to the NOR gate, but the enable signal ENABLE is "1." Accordingly, the first clock CLK1 is continuously output as "0" and simultaneously "0" is fed back and input to the NOR gate through the NOR gate and the six inverters INV1 to INV6. As described above, the first clock CLK1 may not toggle while the enable signal ENABLE is "1."

In this case, the NOR gate and the inverters INV1 to INV6 included in the clock generator 10 are logic gates implemented by the connection of CMOS transistors. Such CMOS transistors may operate with an error depending on a PVT variation of the semiconductor device 1. For example, the CMOS transistors may operate in a state in which the amount of delay of each of the inverters INV1 to INV6 included in the clock generator 10 is greater or smaller than a target amount of delay.

Accordingly, when the semiconductor device 1 was designed, it was expected that the clock generator 10 would generate a target clock having a first target frequency. However, when the clock generator 10 is mounted on the semiconductor device 1 and operates, the clock generator 10 may generate the first clock CLK1 having a frequency different from the first target frequency due to the occurrence of a PVT variation.

Furthermore, the code generator 20 may generate an output code OUT_CODE by varying a value of a code 22 input whenever an input clock 21 toggles, and may receive through feedback (22) the generated output code OUT_CODE. In an embodiment, the code generator 20 may initially receive an input code (e.g., a start code START_CODE or a counting code COUNT_CODE), vary a value of the received input code when the input clock (e.g., the first clock CLK1 or the second clock CLK2) toggles to generate the output code OUT_CODE, and receive a feedback signal FEEDBACK associated with the output code OUT_CODE. For example, the feedback signal FEEDBACK may be obtained by performing a logical operation on a plurality of bits of the output code OUT_CODE. In order to vary the value of the input code 22, the code generator 20 may perform a set operation in a first mode and perform an inverse operation (or an inverse set operation) of the set operation in a second mode. In an embodiment, the code generator 20 may be a linear feedback shift register (LFSR).

Furthermore, the operation controller 30 may control the code generator 20 to enter the first mode in a test section, may transmit the first clock CLK1 and a start code START_CODE to the code generator 20 at a first time when the code generator 20 enters the first mode, and may set the output code OUT_CODE of the code generator 20 as the counting code COUNT_CODE at a second time when the code generator 20 exits from the first mode. That is, after an operation of the test section is started, the operation controller 30 may control the code generator 20 to enter the first mode at the first time through an operation of transmitting the first clock CLK1 generated by the clock generator 10 and the start code START_CODE to the code generator 20. As described above, the operation controller 30 may control the code generator 20 to enter the first mode at the first time by inputting the first clock CLK1 as the input clock 21 of the code generator 20 and inputting the start code START_CODE as the input code 22 of the code generator 20. Accordingly, the code generator 20 may generate the output code OUT_CODE by varying a value of the code 22 input by performing a set operation whenever the first clock CLK1 toggles during the section in which the code generator 20 enters the first mode, and may receive through feedback (22) the generated output code OUT_CODE. In this case, in the section in which the code generator 20 enters the first mode, the code 22 first input to the code generator 20 may be the start code START_CODE, and the code 22 second input to the code generator 20 may be the fed-back output code OUT_CODE.

Accordingly, the code generator 20 may repeatedly perform the set operation by a toggling count of the first clock CLK1 during the section in which the code generator 20 enters the first mode. The term "the section in which the code generator 20 enters the first mode" in the specification may correspond to a first time interval between the first time when the code generator 20 enters the first mode and the second time when the code generator 20 exits from the first mode. For example, during the first time interval when the code generator 20 operates in the first mode, the code generator 20 may initially receive the start code START_CODE from the operation controller 30 as the input code, perform a first set operation when the first clock CLK1 toggles to generate the output code OUT_CODE having a first value, receives a feedback signal FEEDBACK associated with the output code OUT_CODE, perform a second set operation when the first clock CLK1 toggles to generate the output code OUT_CODE having a second value, and so on.

Furthermore, the operation controller 30 may set, as the counting code COUNT_CODE, the output code OUT_CODE, generated by the code generator 20, substantially at the second time when the code generator 20 exits from the first mode. That is, the operation controller 30 may control the code generator 20 to exit from the first mode through an operation of stopping the toggling of the first clock CLK1, generated by the clock generator 10, at the second time when the code generator 20 exits from the first mode. As described above, the operation controller 30 may stop the toggling of the first clock CLK1 provided as the input clock 21 of the code generator 20, may set the output code OUT_CODE as the counting code COUNT_CODE right before the toggling of the first clock CLK1 is stopped, and may store the counting code COUNT_CODE.

Furthermore, the operation controller 30 may control the code generator 20 to enter the second mode in a check section after the test section, may transmit a second clock CLK2 and the counting code COUNT_CODE to the code generator 20 at a third time when the code generator 20 enters the second mode, and may generate monitoring information by counting a toggling count of the second clock CLK2 until the output code OUT_CODE of the code generator 20 has the same value as the start code START_CODE. In this case, the second clock CLK2 may be input from the outside of the monitoring circuit in the state in which the second clock CLK2 has a second target frequency lower than the first target frequency set for the first clock CLK1 in the clock generator 10. That is, after an operation of the check section is started, the operation controller 30 may control the code generator 20 to enter the second mode by transmitting the externally input second clock CLK2 and the counting code COUNT_CODE to the code generator 20. As described above, the operation controller 30 may control the code generator 20 to enter the second mode by inputting the second clock CLK2 as the input clock 21 of the code generator 20 and inputting, as the input code 22 of the code generator 20, the counting code COUNT_CODE having a value set at the second time when the code generator 20 exits from the first mode. Accordingly, the code generator 20 may generate the output code OUT_CODE by varying a value of the code 22 input by performing an inverse operation of the set operation whenever the second clock CLK2 toggles during the section in which the code generator 20 enters the second mode, and may receive through feedback (22) the generated output code OUT_CODE. In this case, in the section in which the code generator 20 enters the second mode, the code 22 first input to the code generator 20 may be the counting code COUNT_CODE, and the code 22 second input to the code generator 20 may be a fed-back output code OUT_CODE. Accordingly, the code generator 20 may repeatedly perform the inverse operation of the set operation by a toggling count of the second clock CLK2 during the section in which the code generator 20 enters the second mode. The term "the section in which the code generator 20 enters the second mode" in the specification may correspond to a second time interval between the third time when the code generator 20 enters the second mode and a fourth time when the code generator 20 exits from the second mode. For example, during the second time interval when the code generator 20 operates in the second mode, the code generator 20 may initially receive the counting code COUNT_CODE from the operation controller 30 as the input code, perform a first inverse set operation when the second clock CLK2 toggles to generate the output code OUT_CODE having a first value, receives a feedback signal FEEDBACK associated with the output code OUT_CODE, perform a second inverse set operation when the second clock CLK2 toggles to generate the output code OUT_CODE having a second value, and so on.

In this case, the counting code COUNT_CODE may be a code generated by the code generator 20 that receives the start code START_CODE as the input code 22 at the first time when the code generator 20 enters the first mode and that performs the set operation by a toggling count of the first clock, for example, N toggling counts during the section in which the code generator 20 enters the first mode. For this reason, when the code generator 20 receives the counting code COUNT_CODE as the input code 22 at the third time when the code generator 20 enters the second mode and performs an $N^{th}$ inverse operation of the set operation in response to the toggling of the second clock CLK2, the output code OUT_CODE of the code generator 20 may have the same value as a value of the start code START_CODE. In this case, N may be a natural number of 1 or more. Accordingly, the operation controller 30 may count a toggling count of the second clock CLK2 until the value of the output code OUT_CODE and the value of the start code START_CODE of the code generator 20 become identical in the section in which the code generator 20 enters the second mode, and may generate the counted value as the monitoring information. That is, the operation controller 30 may stop the operation of counting the toggling count of the second clock CLK2 when the value of the output code OUT_CODE becomes equal to the value of the start code START_CODE of the code generator 20 in the section in which the code generator 20 enters the second mode, and may generate a stopped count value as the monitoring information.

Furthermore, the operation controller 30 may control the code generator 20 to exit from the second mode by stopping the transmission of the second clock CLK2 to the code generator 20, when the value of the output code OUT_CODE becomes equal to the value of the start code START_CODE of the code generator 20 in the section in which the code generator 20 enters the second mode, that is, in response to the generation of the monitoring information.

In other words, the operation controller 30 may control the code generator 20 to enter the first mode by transmitting the first clock CLK1 and the start code START_CODE to the code generator 20 after the operation of the test section is started, and may then control the code generator 20 to exit from the first mode by stopping the toggling of the first clock CLK1 transmitted to the code generator 20 at a time after a lapse of a set time. For example, the operation controller 30 may control the code generator 20 to enter the first mode at a first time when the first clock CLK1 and the start code START_CODE are transmitted to the code generator 20, and control the code generator 20 to exit from the first mode by stopping the toggling of the first clock CLK1 at a second time, a given time interval (e.g., a predetermined time interval) being between the first time and the second time.

More specifically, at a time (e.g., the first time) when edges of the first clock CLK1 and the second clock CLK2 are synchronized after the operation of the test section is started, the operation controller 30 may control the code generator 20 to enter the first mode by transmitting the first clock CLK1 and the start code START_CODE to the code generator 20.

Furthermore, at a time (e.g., the second time) after a lapse of a set time interval (e.g., the first time interval), corresponding to the time when the second clock CLK2 toggles by a set count, from the first time at which the code generator 20 enters the first mode, the operation controller 30 may control the code generator 20 to exit from the first mode by stopping the toggling of the first clock CLK1 transmitted to the code generator 20. For example, the operation controller 30 may control the code generator exit from the first mode at the second time when a toggling number of the second clock reaches a given number (e.g., a predetermined number) from the first time.

Furthermore, the operation controller 30 may control the code generator 20 to enter the second mode by transmitting the second clock CLK2 and the counting code COUNT_CODE to the code generator 20 after the operation of the check section subsequent to the operation of the test section is started, and may control the code generator 20 to exit from the second mode by stopping the transmission of the second clock CLK2 to the code generator 20 in response to the generation of the monitoring information.

More specifically, at a time (e.g., the third time) at which the edge of the second clock CLK2 is synchronized after the operation of the check section subsequent to the operation of the test section is started, the operation controller 30 may control the code generator 20 to enter the second mode by transmitting the second clock CLK2 and the counting code COUNT_CODE to the code generator 20.

Furthermore, in response to the value of the counting code COUNT_CODE and the value of the start code START_CODE becoming identical after a given time interval (e.g., the second time interval) elapses from the third time at which the code generator 20 enters the second mode, that is, the generation of the monitoring information, the operation controller 30 may control the code generator 20 to exit from the second mode by stopping the transmission of the second clock CLK2 to the code generator 20.

Furthermore, the operation controller 30 may start or terminate an operation of the test section or the check section, in response to a control signal CONTROLL input from the outside of the monitoring circuit. For example, the operation controller 30 may start or terminate the test section, or the check section, or both in response to a control signal CONTROLL. In this case, the control signal CONTROLL may be generated by a device (not illustrated) or system (not illustrated) for operating the monitoring circuit. That is, the operation controller 30 may start or terminate the operation of the test section or the check section in response to the control signal CONTROLL.

Whether the control signal CONTROLL has any form, for example, a parallel or serial code form having K bits (K is a natural number of 2 or more) may be set by a designer in various ways. Furthermore, although not specifically illustrated in the drawings, the operation controller 30 may perform the operation of the start section or the check section in response to the control signal CONTROLL, and may output the results of the execution to the outside as acknowledgement for the control signal CONTROLL. For example, the operation controller 30 may perform the operation of the start section or the check section in response to the control signal CONTROLL, and may output the counting code COUNT_CODE and the monitoring information, which may be generated as the results of the execution, to the outside as acknowledgement for the control signal CONTROLL.

More specifically, the operation controller 30 may control the operation of the test section to be started in response to the control signal CONTROLL, and may then control the code generator 20 to enter the first mode and exit from the first mode. That is, the operation controller 30 may determine a time at which the clock generator 10 will generate the first clock CLK1 after the operation of the test section is started in response to the control signal CONTROLL, may determine a time (e.g., the first time) to control the code generator 20 to enter the first mode by transmitting, to the code generator 20, the toggling first clock CLK1, and may determine a set time interval (e.g., the first time interval) corresponding to a duration of the entry section of the first mode.

Likewise, the operation controller 30 may control the operation of the check section to be started in response to the control signal CONTROLL, and may then control the code generator 20 to enter the second mode. That is, the operation controller 30 may determine a time (e.g., the third time) to control the code generator 20 to enter the second mode by transmitting the externally input second clock CLK2 to the code generator 20 after the operation of the check section is started in response to the control signal CONTROLL.

The enable signal ENABLE for turning on/off an operation of the clock generator 10 may be generated by the operation controller 30 in response to the control signal CONTROLL. Specifically, the operation controller 30 may control the clock generator 10 to generate the first clock CLK1 by activating the enable signal ENABLE, for example, to have a first logic value corresponding to "0" in response to the control signal CONTROLL. Furthermore, the operation controller 30 may control the clock generator 10 not to generate the first clock CLK1 by deactivating the enable signal ENABLE, for example, to have a second logic value corresponding to "1" in response to the exit of the code generator 20 from the first mode. That is, the operation controller 30 may control the clock generator 10 to operate and generate the first clock CLK1 only in the section in which the code generator 20 has entered the first mode.

Figure 2A:
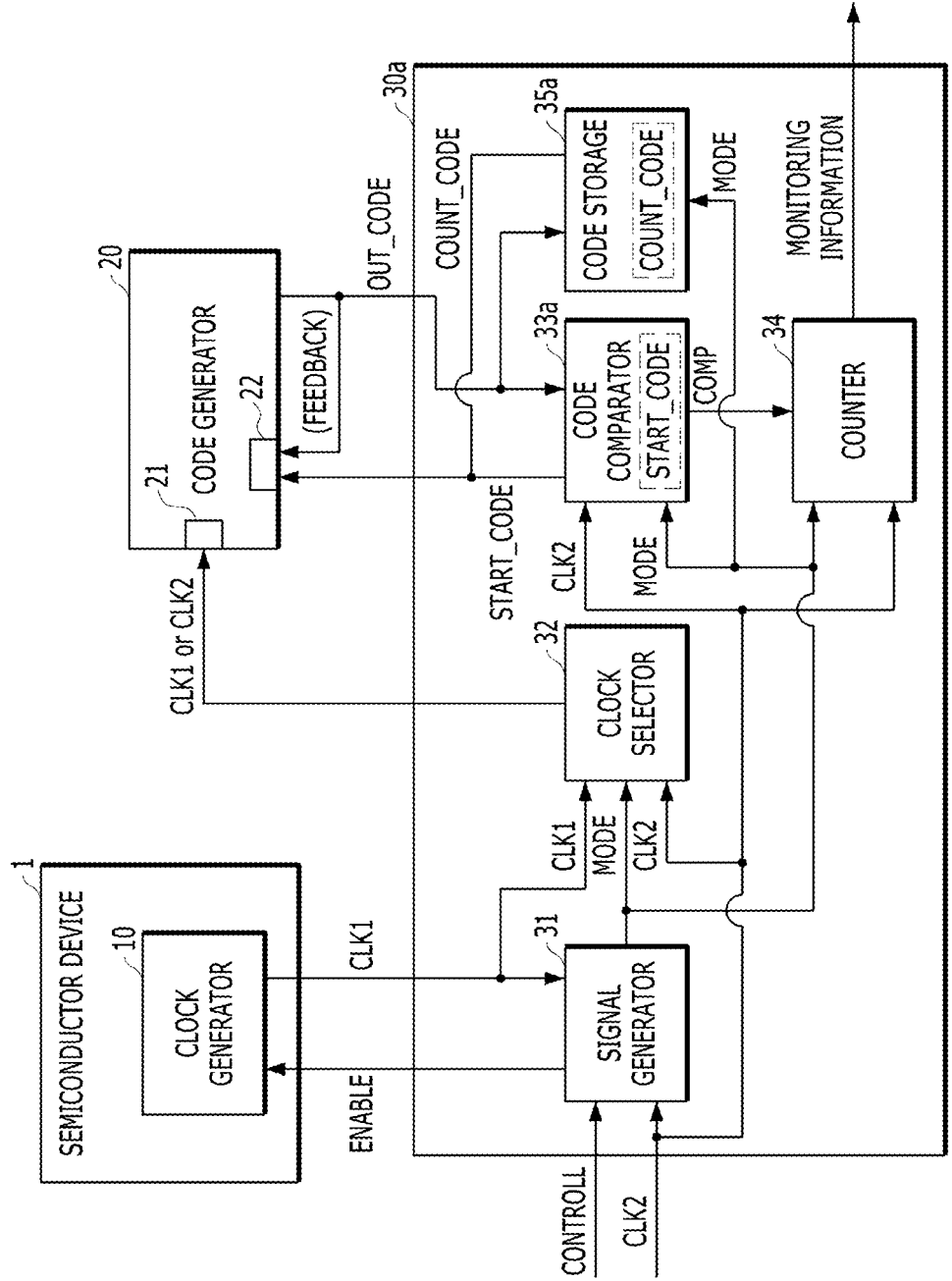
FIG. 2A illustrates an operation controller included in a monitoring circuit according to an embodiment.

FIG. 2A illustrates an operation controller 30a included in a monitoring circuit according to an embodiment.

Figure 2B:
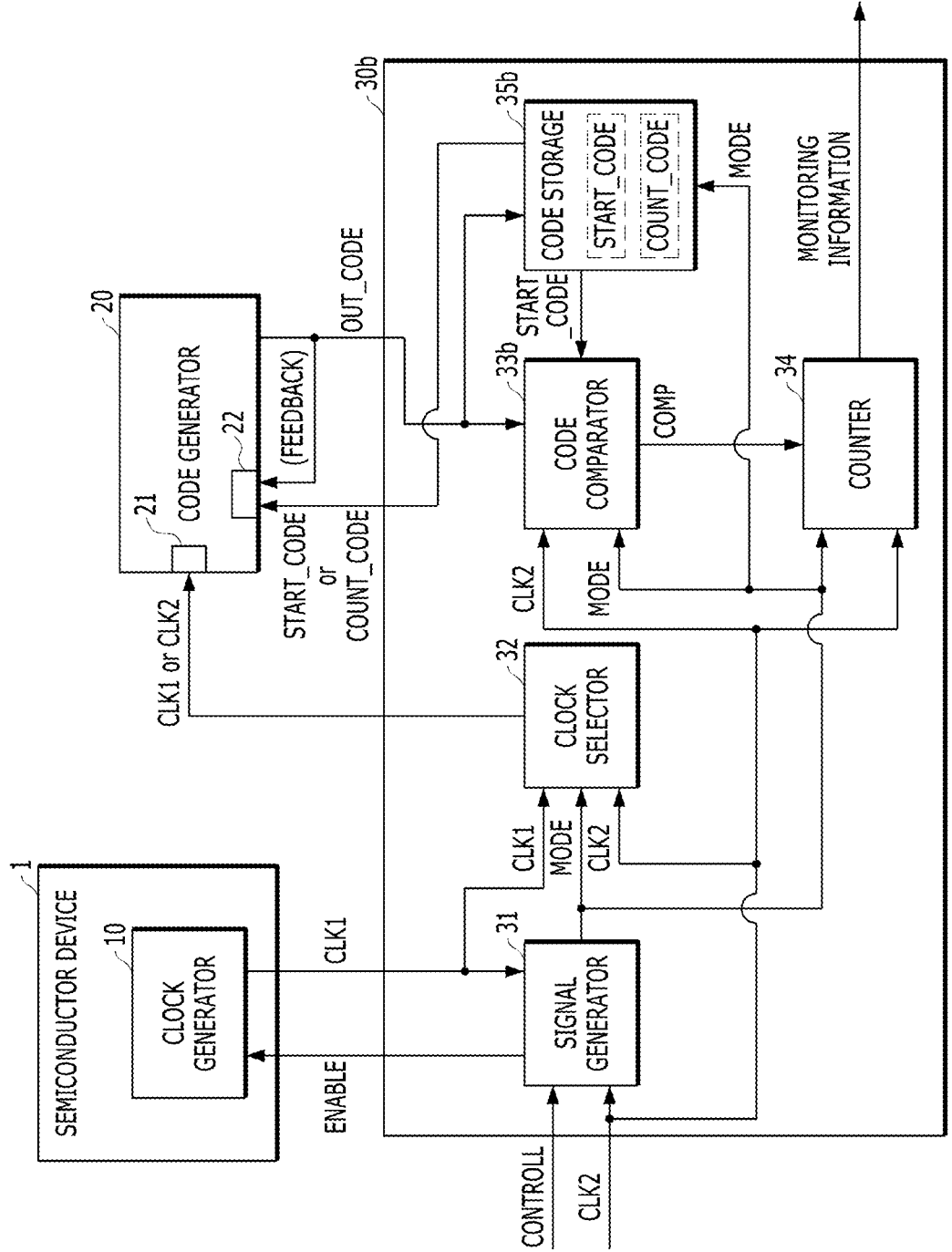
FIG. 2B illustrates an operation controller included in a monitoring circuit according to another embodiment.

FIG. 2B illustrates an operation controller 30b included in the monitoring circuit according to another embodiment.

Referring to FIGS. 2A and 2B together, the operation controller 30a or 30b among the elements of the monitoring circuit described with reference to FIG. 1 may include a signal generator 31, a clock selector 32, a code comparator 33, a code storage 35, and a counter 34.

The signal generator 31 may generate an enable signal ENABLE and a mode selection signal MODE in response to an externally input control signal CONTROLL and second clock CLK2, and the first clock CLK1 generated by the clock generator 10.

Furthermore, the clock selector 32 may control the code generator 20 to enter the first mode by selecting the first clock CLK1, generated by the clock generator 10, in response to the mode selection signal MODE generated by the signal generator 31 and transmitting the first clock CLK1 to the code generator 20. Furthermore, the clock selector 32 may control the code generator 20 to enter the second mode by selecting the externally input second clock CLK2 in response to the mode selection signal MODE generated by the signal generator 31 and transmitting the second clock CLK2 to the code generator 20.

Furthermore, during the section in which the code generator 20 enters the second mode, the code comparator 33 may compare a value of the output code OUT_CODE, received from the code generator 20, and a value of the start code START_CODE whenever the externally input second clock CLK2 toggles. That is, the code comparator 33a may compare a value of the output code OUT_CODE, received from the code generator 20, and a value of the start code START_CODE whenever the second clock CLK2 toggles during the section in which the code generator 20 enters the second mode, whose entry time and exit time are defined through the mode selection signal MODE. When the value of the output code OUT_CODE received from the code generator 20 and the value of the start code START_CODE are identical as a result of the comparison, the code comparator 33a may generate a signal (e.g., a comparison signal) COMP indicating that the value of the output code OUT_CODE and the value of the start code START_CODE are identical, and may transmit the signal to the counter 34.

Furthermore, the code storage 35a may store the output code OUT_CODE, received from the code generator 20, as the counting code COUNT_CODE at a time at which the code generator 20 exits from the first mode, which is defined in response to the mode selection signal MODE generated by the signal generator 31. Furthermore, the code storage 35a may transmit, to the code generator 20, the stored counting code COUNT_CODE, at a time when the code generator 20 enters the second mode, which is defined in response to the mode selection signal MODE generated by the signal generator 31.

Furthermore, the counter 34 may count a toggling count (or a toggling number) of the externally input second clock CLK2 during the section in which the code generator 20 enters the second mode whose entry time and exit time are defined in response to the mode selection signal MODE generated by the signal generator 31, and may generate monitoring information in response to the output signal of the code comparator 33a. That is, the counter 34 may generate, as the monitoring information, the toggling count of the second clock CLK2 which is obtained by counting the toggling count of the second clock CLK2 from a time at which the code generator 20 enters the second mode to a time at which a signal COMP output by the code comparator 33a indicates that a value of the output code OUT_CODE received from the code generator 20 and a value of the start code START_CODE are identical.

Referring to FIG. 2A, the code comparator 33a may store the value of the start code START_CODE. Accordingly, the code comparator 33a may transmit, to the code generator 20, the start code START_CODE at a time when the code generator 20 enters the first mode, which is defined in response to the mode selection signal MODE generated by the signal generator 31. Furthermore, the code comparator 33a may compare a value of the output code OUT_CODE, received from the code generator 20, and a value of the stored start code START_CODE, whenever the second clock CLK2 toggles during the section in which the code generator 20 enters the second mode whose entry time and exit time are defined in response to the mode selection signal MODE generated by the signal generator 31. As described above, if the start code START_CODE is stored in the code comparator 33a, the code storage 35a may store the counting code COUNT_CODE without storing the start code START_CODE.

Referring to FIG. 2B, unlike in FIG. 2A, the start code START_CODE may not be stored in the code comparator 33b. Instead, in FIG. 2B, the start code START_CODE may be stored in the code storage 35b. That is, in FIG. 2B, the start code START_CODE and the counting code COUNT_CODE may be stored in the code storage 35b.

Specifically, the code storage 35b may store the start code START_CODE. Accordingly, the code storage 35b may transmit the stored start code START_CODE to the code generator 20 at a time when the code generator 20 enters the first mode, which is defined in response to the mode selection signal MODE generated by the signal generator 31. Furthermore, the code storage 35b may transmit the stored start code START_CODE to the code comparator 33b during the section in which the code generator 20 enters the second mode whose entry time and exit time are defined in response to the mode selection signal MODE generated by the signal generator 31. Furthermore, the code storage 35*b* may store the output code OUT_CODE, received from the code generator 20, as the counting code COUNT_CODE at a time when the code generator 20 exits from the first mode, which is defined in response to the mode selection signal MODE generated by the signal generator 31. Furthermore, the code storage 35*b* may transmit, to the code generator 20, the stored counting code COUNT_CODE, at a time when the code generator 20 enters the second mode, which is defined in response to the mode selection signal MODE generated by the signal generator 31.

For reference, a time at which the clock selector 32 starts to transmit the first clock CLK1 to the code generator 20 in response to the mode selection signal MODE may be defined as a time at which the code generator 20 enters the first mode. Furthermore, a time at which the clock selector 32 stops the transmission of the first clock CLK1 to the code generator 20 in response to the mode selection signal MODE may be defined as a time at which the code generator 20 exits from the first mode. Furthermore, a time at which the clock selector 32 starts to transmit the second clock CLK2 to the code generator 20 in response to the mode selection signal MODE may be defined as a time at which the code generator 20 enters the second mode. Furthermore, a time at which the clock selector 32 stops the transmission of the second clock CLK2 to the code generator 20 in response to the mode selection signal MODE may be defined as a time at which the code generator 20 exits from the second mode.

Furthermore, the signal generator 31 may generate the mode selection signal MODE in response to the externally input control signal CONTROLL. In this case, the results of an operation of the code generator 20 or the results of an operation of the counter 34 may be incorporated into the externally input control signal CONTROLL in real time. For example, an operation of outputting, by the counter 34, the monitoring information to the outside may be incorporated into the control signal CONTROLL, and thus the signal generator 31 may be controlled to generate the mode selection signal MODE for stopping the transmission of the second clock CLK2 from the clock selector 32 to the code generator 20.

Figure 3:
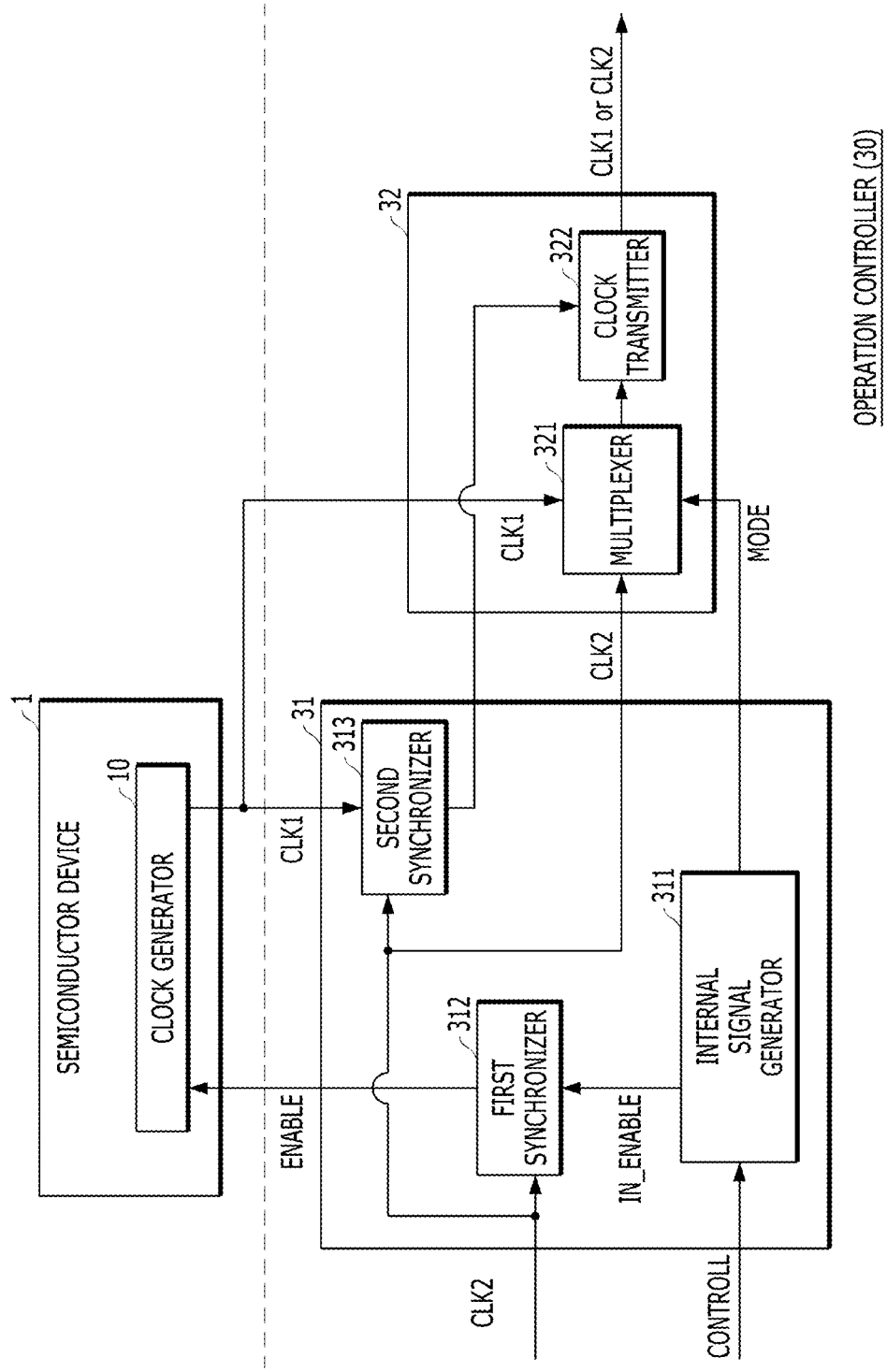
FIG. 3 illustrates a signal generator and a clock selector included in the operation controller of FIG. 2A or 2B according to an embodiment.

FIG. 3 illustrates the signal generator 31 and the clock selector 32 included in the operation controller 30*a* or 30*b* according to an embodiment.

Referring to FIG. 3, the signal generator 31 among the elements of the operation controller 30*a* in FIG. 2A or 30*b* in FIG. 2B may include an internal signal generator 311, a first synchronizer 312, and a second synchronizer 313. Furthermore, the clock selector 32 among the elements of the operation controller 30*a* in FIG. 2A or 30*b* in FIG. 2B may include a multiplexer 321 and a clock transmitter 322.

First, the internal signal generator 311 included in the signal generator 31 may generate an internal enable signal IN_ENABLE and the mode selection signal MODE in response to the externally input control signal CONTROLL. In this case, after an operation of the test section is started in response to the control signal CONTROLL, the internal signal generator 311 may control the code generator 20 to enter the first mode and exit from the first mode. That is, the internal signal generator 311 may determine a time when an operation of the clock generator 10 starts by activating the internal enable signal IN_ENABLE after the operation of the test section has started in response to the control signal CONTROLL. Furthermore, the internal signal generator 311 may determine a time to control the code generator 20 to enter the first mode by controlling the mode selection signal MODE to have a first value, after the operation of the test section has started in response to the control signal CONTROLL, and may determine a set time corresponding to the section in which the code generator 20 enters the first mode based on how long is the duration of a section in which the mode selection signal MODE has the first value. In this case, the internal signal generator 311 may control a time at which the internal enable signal IN_ENABLE is activated and a time at which the mode selection signal MODE is controlled to have the first value to be synchronized with each other. The internal signal generator 311 may control the time at which the internal enable signal IN_ENABLE is activated and the time at which the mode selection signal MODE is controlled to have the first value to be partially different from each other.

Likewise, the internal signal generator 311 may control the code generator 20 to enter the second mode and exit from the second mode after an operation of the check section has started in response to the control signal CONTROLL. That is, the internal signal generator 311 may determine a time to terminate an operation of the clock generator 10 by deactivating the internal enable signal IN_ENABLE after the operation of the check section has started in response to the control signal CONTROLL. Furthermore, the internal signal generator 311 may determine a time to control the code generator 20 to enter the second mode by controlling the mode selection signal MODE to have a second value after the operation of the check section has started in response to the control signal CONTROLL, and may determine a time to control the code generator 20 to exit from the second mode by controlling the mode selection signal MODE to have a third value.

Furthermore, the first synchronizer 312 included in the signal generator 31 may synchronize the internal enable signal IN_ENABLE with an edge of the externally input second clock CLK2, and may transmit the synchronized signal to the clock generator 10 as the enable signal ENABLE.

Furthermore, the second synchronizer 313 included in the signal generator 31 may detect a time at which the first clock CLK1 received from the clock generator 10 and an edge of the externally input second clock CLK2 are synchronized. That is, the second synchronizer 313 may generate an output signal toggling at a time when an edge of the first clock CLK1 and an edge of the second clock CLK2 are synchronized.

In this case, the reason why the edge of the first clock CLK1 and the edge of the second clock CLK2 may be synchronized is that the enable signal ENABLE capable of controlling an operation of the clock generator 10 to be started/terminated is a signal synchronized with the second clock CLK2 through the first synchronizer 312. That is, timing at which the enable signal ENABLE is activated or deactivated may be synchronized with an edge of the second clock CLK2 through the first synchronizer 312. Accordingly, the first clock CLK1 generated by the clock generator 10 and the externally input second clock CLK2 have different toggling frequencies, but edges of the first clock CLK1 and the second clock CLK2 may be synchronized periodically.

Furthermore, the multiplexer 321 included in the clock selector 32 may select any one of the first clock CLK1, generated by the clock generator 10, and the externally input second clock CLK2 in response to the mode selection signal MODE generated by the internal signal generator 311 included in the signal generator 31, and may output the selected clock. That is, the multiplexer 321 may select the first clock CLK1 in response to a value of the mode selection signal MODE corresponding to the section in which the code generator 20 enters the first mode, and may output the selected first clock CLK1. For example, the multiplexer 321 may select the first clock CLK1 in response to the mode selection signal MODE having a first value, and may output the selected first clock CLK1. Furthermore, the multiplexer 321 may select the second clock CLK2 in response to a value of the mode selection signal MODE corresponding to the section in which the code generator 20 enters the second mode, and may output the selected second clock CLK2. For example, the multiplexer 321 may select the second clock CLK2 in response to the mode selection signal MODE having a second value and output the selected second clock CLK2, and may not select any clock in response to the mode selection signal MODE having a third value.

Furthermore, the clock transmitter 322 included in the clock selector 32 may transmit a clock selected by the multiplexer 321, that is, the first clock CLK1 or the second clock CLK2, to the code generator 20, in response to the mode selection signal MODE and a signal output by the second synchronizer 313 included in the signal generator 31. That is, when transmitting, to the code generator 20, the first clock CLK1 or the second clock CLK2 output by the multiplexer 321, the clock transmitter 322 may recover the first clock CLK1 or the second clock CLK2 whose phase is delayed or shaken due to an operation of the multiplexer 321, and may transmit the recovered first clock CLK1 or second clock CLK2.

Figure 4A:
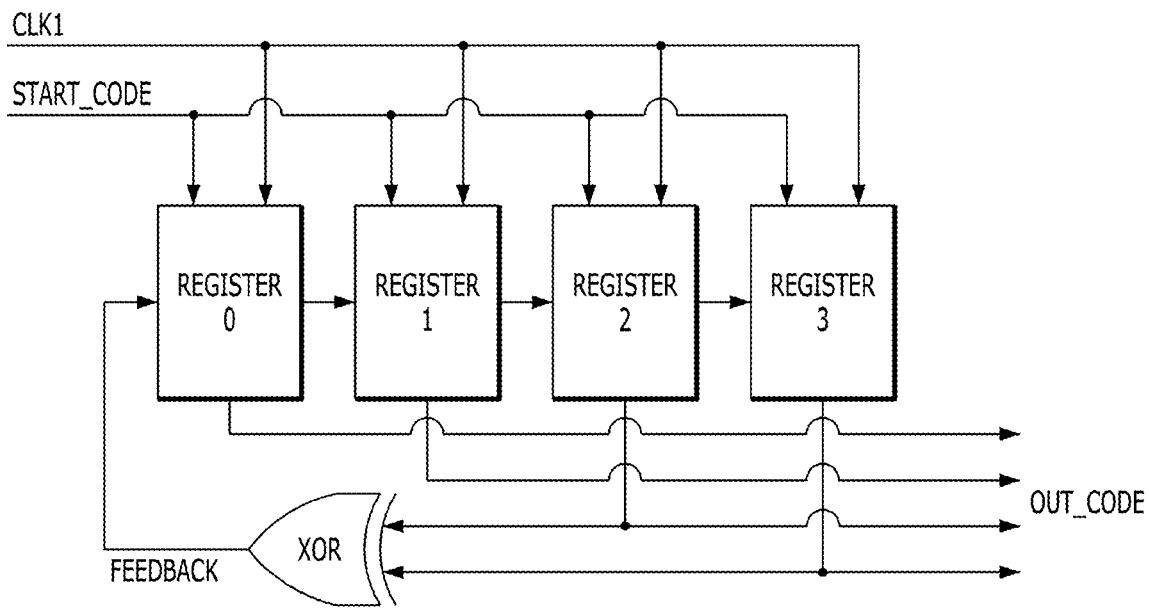
FIGS. 4A, 4B, and 4C are diagrams illustrated to describe a code generator included in a monitoring circuit according to an embodiment.
Figure 4B:
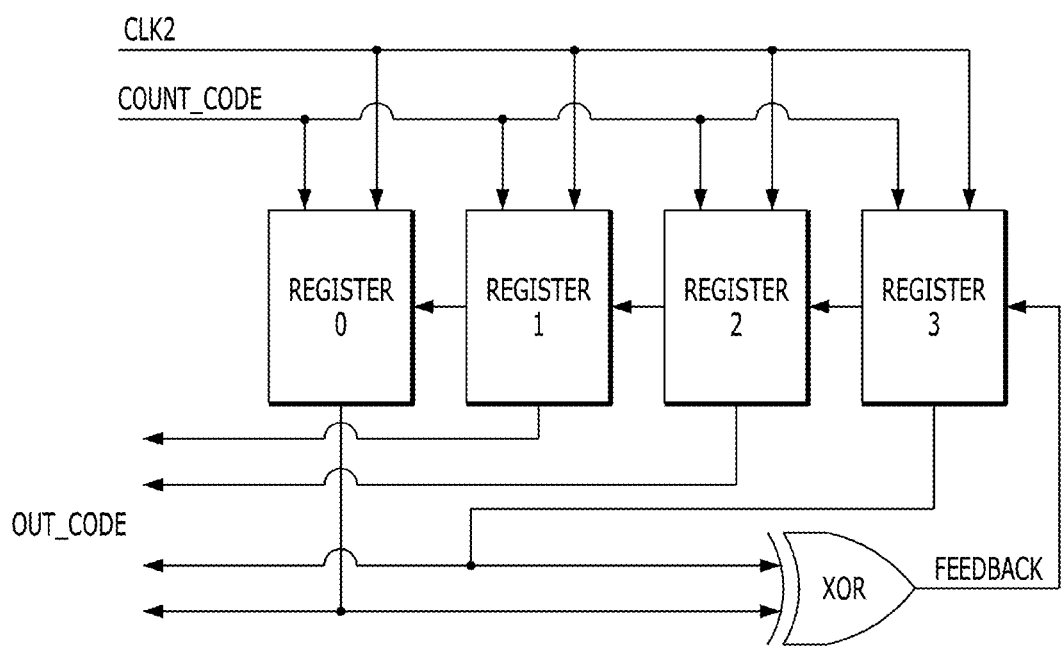
Figure 4C:
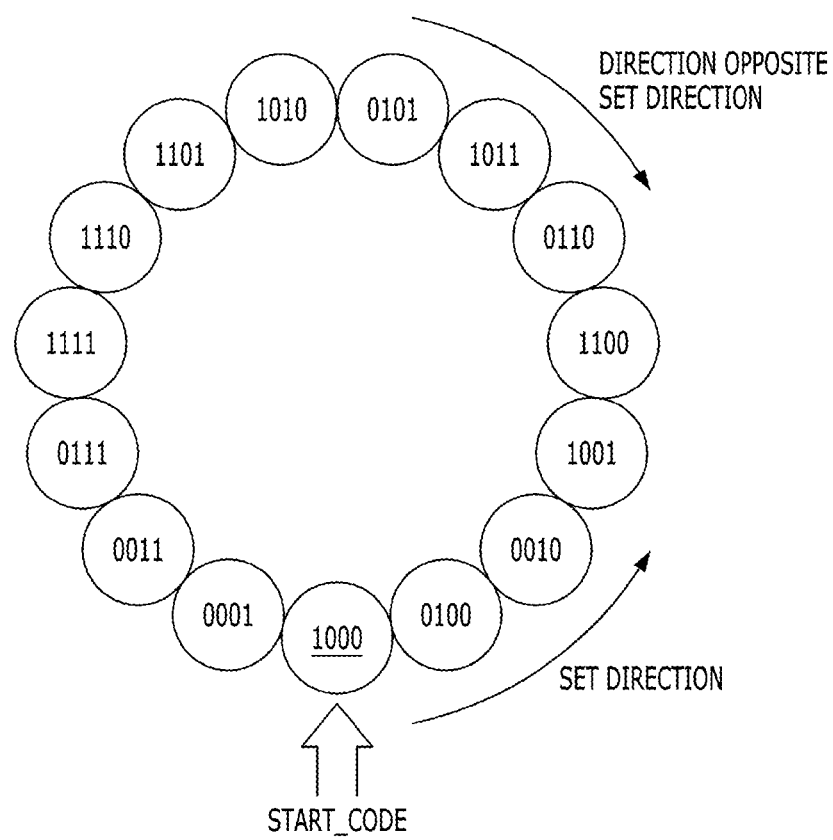

FIGS. 4A, 4B, and 4C are diagrams illustrated to describe an example of the code generator 20 included in the monitoring circuit according to an embodiment.

First, referring to FIGS. 4A and 4B, it may be assumed that the code generator 20 includes at least four shift registers as linear feedback shift registers (LFSRs). However, embodiments of the present disclosure are not limited thereto, and the number of shift registers may vary according to embodiments.

Specifically, it may be assumed that a configuration of the code generator 20 illustrated in FIG. 4A is for a case where the code generator 20 enters the first mode. Furthermore, it may be assumed that a configuration of the code generator 20 illustrated in FIG. 4B is for a case where the code generator 20 enters the second mode.

In this case, as for the four shift registers included in the code generator 20 of FIG. 4A and the four shift registers included in the code generator 20 of FIG. 4B, it may be assumed that the four shift registers that are physically present are operated in different ways depending on an operation mode. As for the four shift registers included in the code generator 20 of FIG. 4A and the four shift registers included in the code generator 20 of FIG. 4B, it may also be assumed that the eight shift registers are physically completely separated from each other.

Referring to FIGS. 1, 4A, and 4C, the code generator 20 may perform an operation of varying a value of the input code 22 in such a way to generate the output code OUT_CODE by varying a value of the code 22 input whenever the input clock 21 toggles and to receive through feedback (22) the generated output code OUT_CODE. In FIG. 4A, an operation for varying a value of the input code 22 may be an operation of shifting each of the four registers from a first register REGISTER 0 to a fourth register REGISTER 3 by 1 bit and an operation of transmitting, as the input of the first register REGISTER 0, 1 bit generated as a result of an XOR operation performed on bits output by the third and fourth registers REGISTER 2 and REGISTER 3, among bits of an output code OUT_CODE generated as a result of the shift operation. In FIG. 4A, since the first clock CLK1 is input as the input clock 21 and the start code START_CODE is input as the input code 22, the code generator 20 may operate in the first mode. That is, in FIG. 4A, the operation for varying a value of the input code 22 is a set operation. A value of the output code OUT_CODE may vary according to a set sequence based on a toggling count of the first clock CLK1.

Referring to FIGS. 1, 4B, and 4C, the code generator 20 may perform an operation of varying a value of the input code 22 in such a way to generate the output code OUT_CODE by varying a value of the code 22 input whenever the input clock 21 toggles and to receive through feedback (22) the generated output code OUT_CODE. In FIG. 4B, an operation for varying a value of the input code 22 may be an operation of shifting each of the four registers from the fourth register REGISTER 3 to the first register REGISTER 0 by 1 bit and an operation of transmitting, as the input of the fourth register REGISTER 3, 1 bit generated as a result of an XOR operation performed on bits output by the first and fourth registers REGISTER 0 and REGISTER 3, among bits of an output code OUT_CODE generated as a result of the shift operation. In FIG. 4B, since the second clock CLK2 is input as the input clock 21 and the counting code COUNT_CODE is input as the input code 22, the code generator 20 may operate in the second mode. That is, in FIG. 4B, the operation for varying a value of the input code 22 is an inverse operation of a set operation. A value of the output code OUT_CODE may vary in a direction opposite a set sequence based on a toggling count of the second clock CLK2.

As illustrated in FIG. 4C, when a value of the start code START_CODE is "1000," if a set operation is performed as the first clock CLK1 toggles, the output code OUT_CODE having a value "0100" may be generated. Furthermore, in the state in which the output code OUT_CODE having the value "0100" has been fed back and input, if the set operation is performed as the first clock CLK1 toggles, the output code OUT_CODE having a value "0010" may be generated. In this way, a value of the output code OUT_CODE may be different depending on how many times the set operation is repeatedly performed from the start code START_CODE. That is, a difference between a value of the start code START_CODE and a value of the output code OUT_CODE may be information indicating how many times the first clock CLK1 has toggled.

In contrast, when a value of the counting code COUNT_CODE is "0101," if an inverse operation of the set operation is performed as the second clock CLK2 toggles, the output code OUT_CODE having a value "1011" may be generated. Furthermore, in the state in which the output code OUT_CODE having the value "1011" has been fed back and input, if the inverse operation of the set operation is performed as the second clock CLK2 toggles, the output code OUT_CODE having a value "0110" may be generated. In this way, if the inverse operation of the set operation is repeatedly performed from the counting code COUNT_CODE, the output code OUT_CODE having the same value as the start code START_CODE may be generated at a certain time. That is, a toggling count of the second clock CLK2, which is necessary to make a value of the counting code COUNT_CODE identical with a value of the start code START_CODE, may be generated as the monitoring information.

According to embodiments of the present disclosure, a ring oscillator included in a semiconductor device inputs, to linear feedback shift registers (LFSRs), a clock (e.g., the first clock CLK1) generated to have a relatively high frequency along with a start code (e.g., the start code START_CODE). The LFSRs may perform a set operation corresponding to a high-speed toggling operation, and generate a counting code (e.g., the counting code COUNT_CODE) as the results of the set operation. Thereafter, the LFSRs receive an external input clock (e.g., the second clock CLK2) having a relatively low frequency along the counting code, and perform an inverse operation of the set operation corresponding to a low-speed toggling operation. Accordingly, a toggling count of a clock necessary between the start code and the counting code can be counted at a low speed.

Accordingly, there is an effect in that a toggling count of a clock generated to have a high frequency by the ring oscillator can be accurately counted. For example, a monitoring circuit according to an embodiment of the present disclosure includes a code generator varying an output code from a start code to generate the counting code by performing one or more set operations using a first clock having a relatively high frequency in a first mode. Such a code generator may include linear feedback shift registers (LFSRs) and a logic gate (e.g., an XOR gate), and thus may be suitable for performing the set operations using the first clock having the relatively high frequency to generate the counting code. The code generator further varies the output code from the counting code until the output code becomes equal to the start code by performing one or more inverse set operations using a second clock having a relatively low frequency in a second mode. A counter in the monitoring circuit counts a toggling number of the second clock signal during a time interval when the monitoring circuit operates in the second mode. As a result, the monitoring circuit may accurately calculate a toggling number of a clock having a high frequency by the ring oscillator without using a high-speed counter.

In an embodiment, a method for controlling a monitoring circuit includes providing a first clock as an input clock and a start code as an input code to a code generator at a first time when the code generator enters a first mode, varying a value of the input code to generate an output code by performing one or more set operations in the first mode, setting the output code as a counting code at a second time when the code generator exits the first mode, providing a second clock as the input clock and the counting code as the input code at a third time when the code generator enters a second mode, the second clock having a frequency lower than that of the first clock, varying the value of the input code to generate the output code by performing one or more inverse set operations in the second mode, and counting a toggling number of the second clock in the second mode until a value of the output code becomes equal to that of the start code to generate monitoring information.

In an embodiment, the method further includes controlling the code generator to enter the first mode at the first time and controlling the code generator to exit from the first mode at the second time, a first time interval between the first time and the second time being predetermined.

In an embodiment, the method further includes controlling the code generator to enter the second mode at the third time and controlling the code generator to exit from the second mode at a fourth time in response to the generated monitoring information.

In an embodiment, the code generator performs the set operations when the first clock toggles in the first mode, and the code generator performs the inverse set operations when the second clock toggles in the second mode.

In an embodiment, the code generator includes a plurality of registers generating the output code and a logic gate receiving a plurality of bits of the output code and performing a logical operation on the received bits of the output code to provide a signal indicative of a logical operation result to one of the registers.

Although various embodiments have been described for illustrative purposes, it will be apparent to those skilled in the art that various changes and modifications may be made without departing from the spirit and scope of the disclosure as defined in the following claims.

What is claimed is:

1. A monitoring circuit, comprising:

a clock generator suitable for generating a first clock having a first frequency, the first frequency being different from a target frequency depending on a process, voltage, and temperature (PVT) variation;

a code generator suitable for generating an output code by varying a value of an input code in response to an input clock, receiving a feedback signal associated with the output code, and varying the value of the input code by performing one or more set operations in a first mode and performing one or more inverse set operations in a second mode; and an operation controller suitable for controlling the code generator to enter the first mode in a test section, transmitting the first clock and a start code as the input clock and the input code, respectively, to the code generator at a first time when the code generator enters the first mode, setting the output code as a counting code at a second time when the code generator exits from the first mode, controlling the code generator to enter the second mode in a check section, transmitting a second clock and the counting code as the input clock and the input code, respectively, to the code generator at a third time when the code generator enters the second mode, and counting a toggling number of the second clock in the second mode until the output code has a value identical with a value of the start code to generate monitoring information, wherein the operation controller receives, from an outside of the monitoring circuit, the second clock having a second target frequency lower than the first target frequency.

2. The monitoring circuit of claim 1, wherein the operation controller:

controls the code generator to enter the first mode at the first time in the test section; and controls the code generator to exit from the first mode at the second time, a first time interval between the first time and the second time being predetermined.

3. The monitoring circuit of claim 2, wherein the operation controller:

controls the code generator to enter the second mode at the third time in the check section; and controls the code generator to exit from the second mode at a fourth time in response to the generated monitoring information.

4. The monitoring circuit of claim 3, wherein the operation controller starts or terminates the test section, or the check section, or both in response to an externally input control signal.

5. The monitoring circuit of claim 4, wherein the toggling number of the second clock in the second mode is a first toggling number, and wherein the operation controller:

controls the code generator to enter the first mode at the first time when edges of the first clock and the second clock are synchronized after the test section has started; and controls the code generator to exit from the first mode at the second time when a second toggling number of the second clock reaches a given number from the first time.

6. The monitoring circuit of claim 5, wherein the operation controller:

controls the code generator to enter the second mode at the third time when an edge of the second clock is synchronized after the operation of the check section has started; and controls the code generator to exit from the second mode at the fourth time when the edge of the second clock is synchronized after the monitoring information has been generated.

7. The monitoring circuit of claim 6, wherein the clock generator generates the first clock in response to an enable signal received from the operation controller.

8. The monitoring circuit of claim 7, wherein the operation controller:

controls the clock generator to generate the first clock by activating the enable signal in response to the control signal; and controls the clock generator to stop generating the first clock by deactivating the enable signal when the code generator exits from the first mode.

9. The monitoring circuit of claim 8, wherein the operation controller comprises:

a signal generator suitable for generating the enable signal and a mode selection signal in response to the control signal and the first and second clocks;

a clock selector suitable for selecting the first clock during the first time interval of the first mode in response to the mode selection signal, transmitting the selected first clock to the code generator during the first time interval, selecting the second clock during a second time interval of the second mode, the second time interval being between the third time and the fourth time, and transmitting the selected second clock to the code generator during the second time interval;

a code comparator suitable for comparing a value of the output code and a value of the start code when the second clock toggles during the second time interval in response to the mode selection signal;

a code storage suitable for storing the output code as the counting code at the second time when the code generator exits from the first mode, and transmitting the stored counting code to the code generator at the third time when the code generator enters the second mode; and a counter suitable for counting the first toggling number of the second clock during the second time interval of the second mode in response to the mode selection signal and generating the monitoring information in response to an output signal of the code comparator.

10. The monitoring circuit of claim 9, wherein the code comparator:

stores the start code;

transmits the stored start code to the code generator at the first time when the code generator enters the first mode, the first time being determined in response to the mode selection signal; and compares a value of the output code and a value of the stored start code when the second clock toggles during the second time interval of the second mode.

11. The monitoring circuit of claim 9, wherein the code storage:

stores the start code;

transmits the stored start code to the code generator at the first time when the code generator enters the first mode, the first time being determined in response to the mode selection signal; and transmits the stored start code to the code comparator during the second time interval of the second mode.

12. The monitoring circuit of claim 9, wherein the signal generator comprises:

an internal signal generator suitable for generating an internal enable signal and the mode selection signal in response to the control signal;

a first synchronizer suitable for synchronizing the internal enable signal with an edge of the second clock and transmitting the synchronized internal enable signal as the enable signal to the clock generator; and a second synchronizer suitable for detecting a time at which edges of the first clock received from the clock generator and the second clock are synchronized.

13. The monitoring circuit of claim 9, wherein the clock selector comprises:

a multiplexer suitable for selecting one of the first clock and the second clock in response to the mode selection signal; and a clock transmitter suitable for transmitting the selected clock to the code generator in response to an output signal of the second synchronizer.

14. A method for controlling a monitoring circuit, the method comprising:

providing a first clock as an input clock and a start code as an input code to a code generator at a first time when the code generator enters a first mode;

varying a value of the input code to generate an output code by performing one or more set operations in the first mode;

setting the output code as a counting code at a second time when the code generator exits the first mode;

providing a second clock as the input clock and the counting code as the input code at a third time when the code generator enters a second mode, the second clock having a frequency lower than that of the first clock;

varying the value of the input code to generate the output code by performing one or more inverse set operations in the second mode; and counting a toggling number of the second clock in the second mode until a value of the output code becomes equal to that of the start code to generate monitoring information.

15. The method of claim 14, further comprising:

controlling the code generator to enter the first mode at the first time; and controlling the code generator to exit from the first mode at the second time, a first time interval between the first time and the second time being predetermined.

16. The method of claim 14, further comprising:
controlling the code generator to enter the second mode at the third time; and
controlling the code generator to exit from the second mode at a fourth time in response to the generated monitoring information.

17. The method of claim 14, wherein the code generator performs the set operations when the first clock toggles in the first mode, and the code generator performs the inverse set operations when the second clock toggles in the second mode.

18. The method of claim 17, wherein the code generator includes:
a plurality of registers generating the output code; and
a logic gate receiving a plurality of bits of the output code and performing a logical operation on the received bits of the output code to provide a signal indicative of a logical operation result to one of the plurality of registers.

* * * * *